(12) United States Patent
Mohan et al.

(10) Patent No.: US 6,262,603 B1
(45) Date of Patent: Jul. 17, 2001

(54) RC CALIBRATION CIRCUIT WITH REDUCED POWER CONSUMPTION AND INCREASED ACCURACY

(75) Inventors: Jitendra Mohan, Sunnyvale; Devnath Varadarajan, Mountain View; Vijaya Ceekala, Union City, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/515,183

(22) Filed: Feb. 29, 2000

(51) Int. Cl.[7] .................................................. H03K 5/22
(52) U.S. Cl. .............................. 327/77; 327/518
(58) Field of Search ..................... 327/77, 80, 81, 327/85, 89, 131, 132, 134, 135, 137, 138, 140, 518

(56) References Cited

U.S. PATENT DOCUMENTS 5,387,882 * 2/1995 Schoofs ................................ 331/111

* cited by examiner

*Primary Examiner*—Jeffrey Zweizig
(74) *Attorney, Agent, or Firm*—Pillsbury Winthrop LLP

(57) ABSTRACT

An RC calibration circuit, which utilizes a resistor and a variable capacitor connected in parallel, reduces power consumption and increases the accuracy of the calibration by comparing the voltage on the resistor to the voltage on the capacitor after a predetermined time has expired since the capacitor began charging up. The result of the comparison, which indicates whether the voltage on the resistor is greater than the voltage on the capacitor, is then used to adjust the capacitance of the capacitor to servo the RC time constant to a predetermined value.

18 Claims, 3 Drawing Sheets

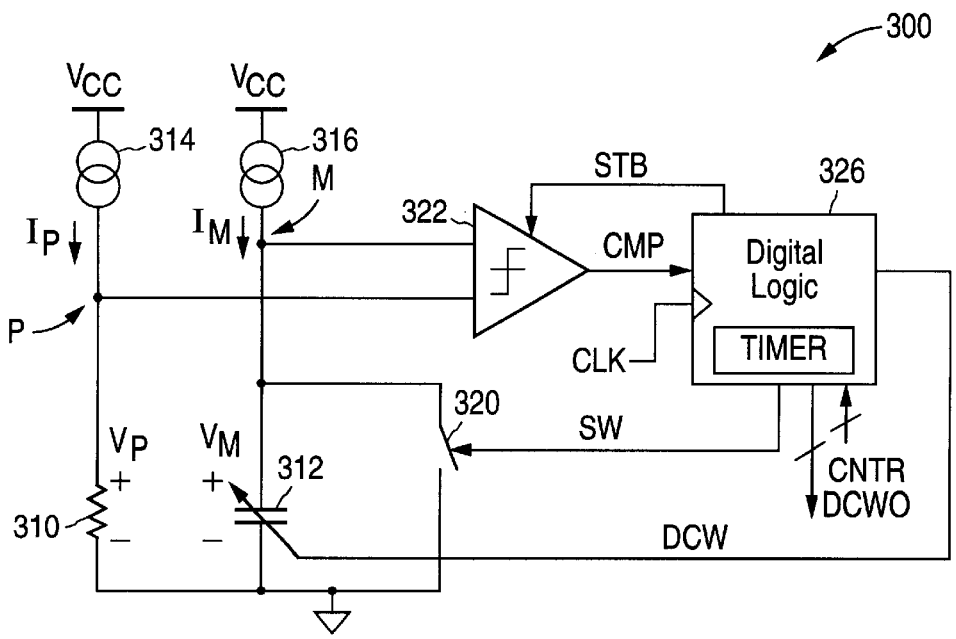
FIG. 3
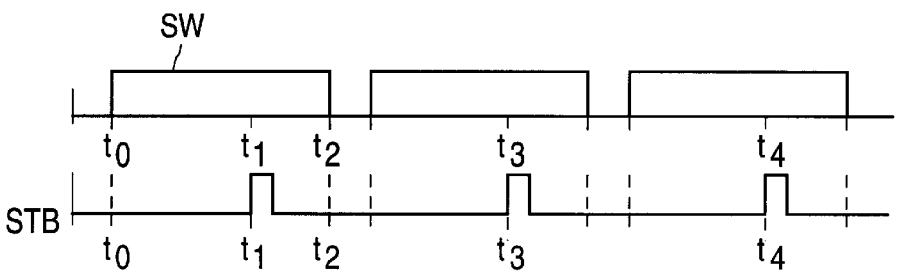
FIG. 4A
FIG. 4B
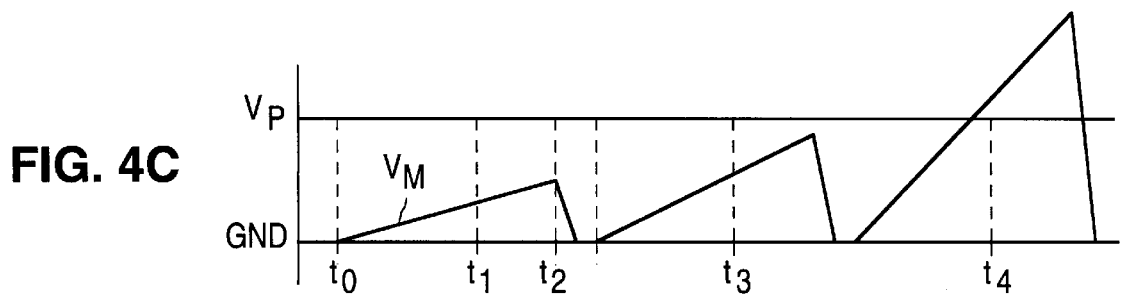
FIG. 4C
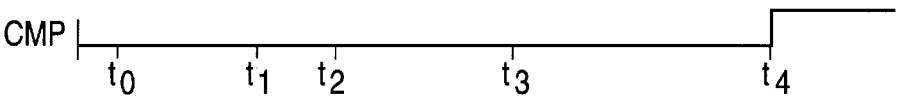
FIG. 4D
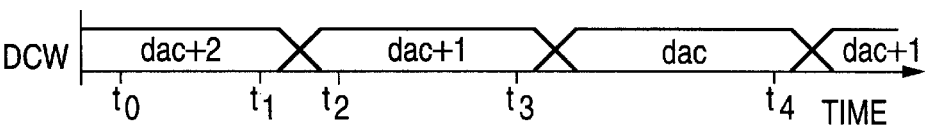
FIG. 4E

RC CALIBRATION CIRCUIT WITH REDUCED POWER CONSUMPTION AND INCREASED ACCURACY

BACKGROUND OF THE INVENTION

1. Field of the Invention

The present invention relates to RC calibration circuits and, more particularly, to a RC calibration circuit that significantly reduces design complexity and provides greater accuracy while consuming significantly less power.

2. Description of the Related Art

On chip resistors and capacitors are commonly used in modern integrated circuits to control the frequency of poles and zeros. Often times, however, resistors can vary in value from 30 to over 100% due to variations in process, voltage, and temperature, while capacitors can vary in value from 10 to 30%. With these huge variations in values, it is difficult to tightly control the locations of the poles and zeros.

One way of compensating for these huge variations is to use a variable capacitor which is controlled by an RC calibration loop. The calibration loop simply adjusts the capacitance C of the variable capacitor, thereby adjusting the value of the RC time constant, until the location of the resulting pole or zero is placed in a desired location.

FIG. 1 shows a block diagram that illustrates a conventional RC calibration circuit 100. As shown in FIG. 1, circuit 100 includes a resistor 110 and a variable capacitor 112 that are connected in parallel between a node N and ground. In addition, a current source 114 sources a current $I_N$ into node N. A voltage $V_N$, in turn, is defined across resistor 110 and capacitor 112.

Resistor 110, which has a resistance $R_N$, is typically implemented as a polysilicon resistor. Variable capacitor 112, which has a capacitance $C_N$, is typically implemented as a capacitor digital-to-analog converter (DAC). The capacitor DAC receives a digital control word DCW, and then sets the capacitance CN to a value that is defined by the control word DCW.

As further shown in FIG. 1, circuit 100 additionally includes a switch 120 which is connected between node N and ground, and an analog comparator 122 which has a first input connected to node N, a second input connected to a reference voltage $V_{REF}$, and an output. Comparator 122 outputs a comparison signal CMP with a first logic state when the voltage $V_N$ is less than the reference voltage $V_{REF}$, and a second logic state when the voltage $V_N$ is greater than the reference voltage $V_{REF}$.

Circuit 100 also includes a counter 124 which is connected to receive a clock signal CLK from a clock source, and the compare signal CMP from comparator 122. Counter 124 is also connected to receive a switch pulse SW, and to output a count CT. Further, circuit 100 includes a control logic block 126 which outputs the control word DCW to capacitor 112, and the switch pulse SW to switch 120 and counter 124. In addition, logic block 126 receives the comparison signal CMP from comparator 122, and the count CT from counter 124.

FIGS. 2A–2C show timing diagrams that illustrate the operation of circuit 100. Prior to operation, which begins at time $t_0$, switch 120 is closed. As a result, the voltage $V_N$ is equal to ground. When operation begins at time $t_0$, logic block 126 outputs the switch pulse SW. In response to the rising edge of the switch pulse SW, switch 120 opens, and counter 124 begins counting the rising edges of the clock signal CLK.

At the same time, as shown in FIGS. 2A–2C, the voltage $V_N$, which is across resistor 110 and capacitor 112, and on the first input of comparator 122, rises exponentially as described by the following equation:

$$V_N = V_0(1-e^{t/\tau}), \qquad \text{EQ. 1}$$

where Vo represents the maximum voltage across capacitor 112, t represents the elapsed time, and τ represents the RC time constant (which is the product of the RC values of resistor 110 and capacitor 112).

When the voltage $V_N$ exceeds the reference voltage $V_{REF}$, comparator 122 changes the logic state of the compare signal CMP. In response, counter 124 stops counting, and logic block 126 captures the count CT held by counter 124. After logic block 126 has captured the count CT, the falling edge of the switch pulse SW causes switch 120 to close, and counter 124 to be reset to zero. When switch 120 closes, the voltage $V_N$ discharges back to ground. Once back to ground, circuit 100 is ready to begin another comparison with the next rising edge of the switch signal SW.

The count CT captured from counter 124 is an accurate measure of the time t that elapsed from time to to time $t_{CMPO}$, the time at which the voltage $V_N$ first exceeded the reference voltage $V_{REF}$. Since the voltage $V_N$ is equal to the reference voltage $V_{REF}$ at time $t_{cMPo}$ (within one least significant bit of the count), and the time t is equal to $t_{CMPO-to}$, logic block 126 can solve EQ. 1 for the time constant τ.

If the time constant τ is less than a predetermined time constant that corresponds with the desired location of a pole, logic block 126 updates the control word DCW to increase the capacitance $C_N$, and then outputs the updated control word DCW to capacitor 112. On the other hand, if the time constant τ is greater than the predetermined time constant, logic block 126 updates the control word DCW to decrease the capacitance $C_N$, and then outputs the updated control word DCW to capacitor 112.

This process is then repeated to servo the capacitance $C_N$ of capacitor 112, and thereby the RC time constant τ, to the value of the predetermined time constant. For example, in the first period, if the time constant τ, which is solved for using the count CT to define the time $t_{CMP0}-t_0$, is less than the predetermined time constant, the control word DCW is increased to increase the capacitance $C_N$. In the second period, if the time constant τ, which is solved for using the count CT to define the time $t_{CMP1}-t_1$, is again less than the predetermined time constant, although greater than the previous time constant, the control word DCW is again increased to further increase the capacitance $C_N$.

In the third period, if the time constant τ, which is solved for using the count CT to define the time $t_{CMP2}-t_2$, is now greater than the predetermined time constant, the control word DCW is decreased to decrease the capacitance $C_N$. Thus, the capacitance $C_N$, and thereby the RC time constant τ, is servoed to a predetermined time constant that corresponds with the desired location of a pole.

One of the problems with circuit 100 is that the voltages $V_N$ and $V_{REF}$ vary over process, voltage, and temperature variations. Even if the voltages $V_N$ and $V_{REF}$ are formed using resistors and bandgap current sources, the resistors vary considerably over process, voltage, and temperature as noted above.

Another problem with circuit 100 is that it is difficult to design a comparator that continuously compares the voltage $V_N$ on the first input to the reference voltage $V_{REF}$ on the second input. In classic implementations, this problem is eliminated by using strobed comparators. A strobed comparator compares the values on the first and second inputs every clock cycle to determine when the voltage $V_N$ on the first input exceeds the reference voltage $V_{REF}$ on the second input.

However, by performing a comparison every clock cycle, strobed comparators burn up power every cycle, resulting in increased power dissipation. In addition, if a comparison is made each clock cycle, the comparator must be reset each clock cycle. Resetting the comparator each clock cycle limits the speed of the comparator which, in turn, limits the accuracy of the calibration circuit.

Phase-locked-loops (PLL) are also utilized in some schemes to control the value of the capacitance $C_N$ of capacitor 112. Traditional PLLs, however, require some kind of analog-to-digital conversion (ADC) to provide the digital control word to capacitor 112.

Thus, there is a need for an RC calibration circuit that allows the time constant τ to be set to a value that is substantially equal to a predetermined time constant while consuming less power and providing greater accuracy.

SUMMARY OF THE INVENTION

The RC calibration circuit of the present invention provides greater accuracy with less power by comparing the voltage across a resistor with the voltage across a capacitor after a predetermined time has expired since the capacitor started charging up. The result of the comparison, which indicates whether the voltage on the resistor is greater than the voltage on the capacitor, is then used to adjust the capacitance of the capacitor to servo the RC time constant to a predetermined value.

In accordance with the present invention, a RC calibration circuit includes a first current source that sources a first current into a first node, a second current source that sources a second current into a second node, and a switch that is connected between the second node and ground. The switch has an open position and a closed position.

In addition, the circuit also includes a resistor that is connected between the first node and ground, and a variable capacitor that is connected between the second node and ground. The resistor generates a first voltage in response to the first current. The capacitor has a plurality of capacitances, and selects one of the capacitances in response to a control word. The capacitor forms a second voltage in response to the second current linearly charging up the capacitor when the switch is in the open position.

The circuit further includes a strobed comparator which has a first input connected to the second node, a second input connected to the first node, and an output. The comparator compares the first voltage to the second voltage in response to a strobe signal, and outputs an indication of whether the first voltage is greater than the second voltage.

The circuit additionally includes a control logic block that is connected to the switch, the capacitor, and the comparator. The logic block controls the opening and closing of the switch and the output of the strobe signal such that the comparator compares the first voltage to the second voltage after a predefined time has elapsed since the switch was placed in the open position.

The control logic block also adjusts the control word in response to the indication from the comparator. Alternately, the control logic block can average a number of indications to form an averaged indicator, and adjust the control word in response to the averaged indicator.

In addition, the control logic block includes a divider that receives a first periodic signal that has a first frequency, and outputs a second periodic signal that has a second frequency where the second frequency is less than the first frequency.

The control logic block also includes a timer that counts a predefined number of first periodic signals, and outputs a time-out signal when the predefined number of first periodic signals have been counted. The predefined number of first periodic signals defines the predefined time.

The control logic block further includes a state machine that commands the timer to begin counting, and the switch to open in response to the second periodic signal. The state machine also outputs a strobe signal in response to the time-out signal, adjusts the control word in response to the indication, and outputs the control word to the capacitor.

In addition, the present invention also includes a method for calibrating a RC time constant. The method includes the steps of generating a first voltage, and forming a second voltage by charging up a capacitor. The method also includes the step of counting a predefined number of first periodic signals with a timer.

The method further includes the step of comparing the first voltage to the second voltage with a comparator after the predefined number of first periodic signals have elapsed as determined by the timer. The method additionally includes the step of outputting from the comparator an indication of whether the first voltage is greater than the second voltage.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIG. 3 is a schematic diagram illustrating a RC calibration circuit 300 in accordance with the present invention.

FIGS. 4A–4E are timing diagrams illustrating the operation of circuit 300.

DETAILED DESCRIPTION

Figure 1:
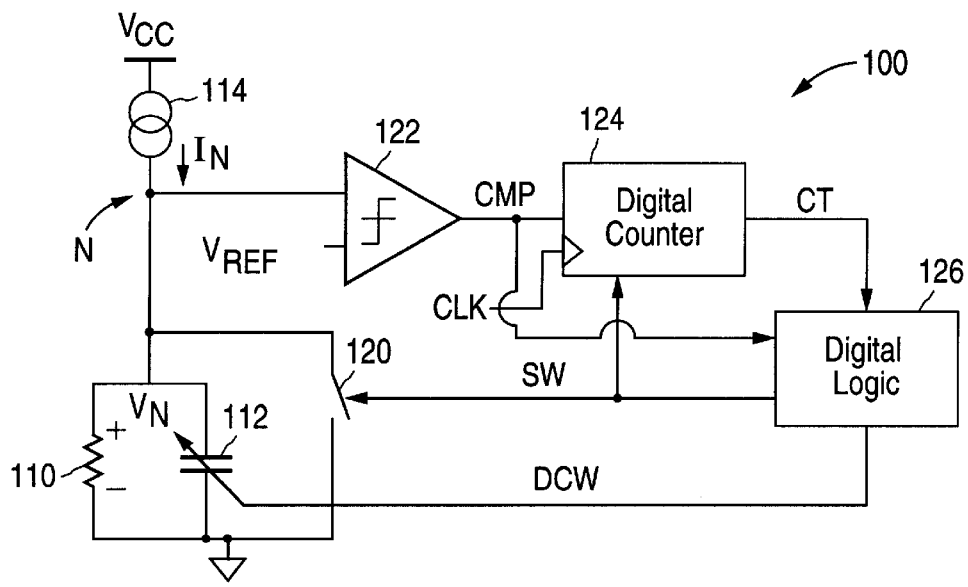
FIG. 1 is a block diagram illustrating a conventional RC calibration circuit 100.
Figure 2A:
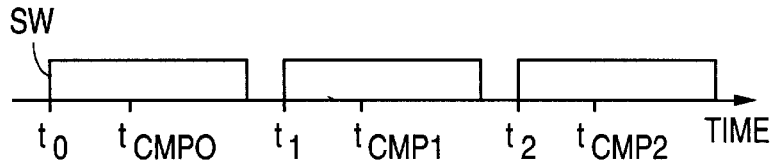
FIGS. 2A–2C are timing diagrams illustrating the operation of circuit 100.
Figure 2B:
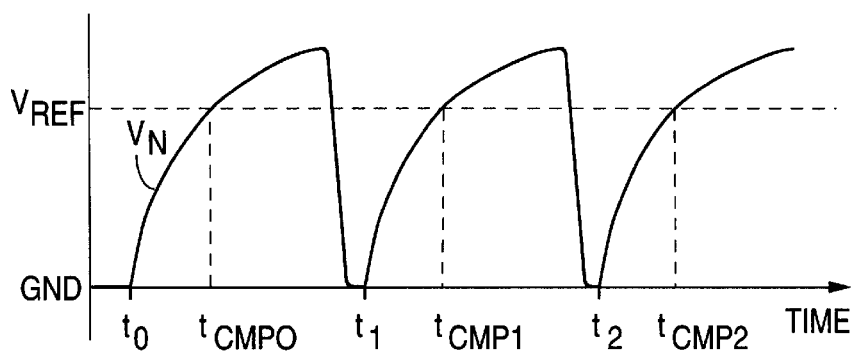
Figure 2C:
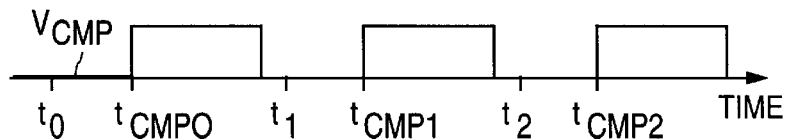

FIG. 3 shows a schematic diagram that illustrates a RC calibration circuit 300 in accordance with the present invention. As shown in FIG. 3, circuit 300 includes a resistor 310 that is connected between a node P and ground, and a variable capacitor 312 that is connected between a node M and ground. A voltage $V_P$, in turn, is defined across resistor 310, while a voltage $V_M$ is defined across capacitor 312.

Resistor 310, which has a resistance $R_P$, can be implemented, for example, as a polysilicon (poly) resistor. Variable capacitor 312, which has a capacitance $C_M$, can be implemented, for example, as a capacitor digital-to-analog converter (DAC). The capacitor DAC receives a digital control word DCW, and then sets the capacitance $C_M$ to a value that is defined by the control word DCW. In the preferred embodiment, capacitor 312 is implemented as a six-bit binary weighted DAC along with a fixed capacitor that is equal to four-times the least significant bit (LSB) of the control word DCW.

In addition, a first current source 314 sources a constant current $I_p$ into node P, while a second current source 316 sources a constant current $I_M$ into node M. Current source 314 includes a source resistor which is formed to be substantially the same as resistor 310. The current $I_p$ is formed by dropping a bandgap voltage across the source resistor.

Currents $I_P$ and $I_M$ are constant for a given operating condition, but vary as process, voltage, and temperature vary. One of the advantages of this arrangement is that process, voltage, and temperature variations tend to cause the first resistor and resistor 310 to vary in the same direction. As a result, the voltage $V_p$ is relatively stable over process, voltage, and temperature variations. The current $I_M$, which charges up capacitor 312, is a mirrored and scaled value of current $I_p$ (current $I_M$ may also be equal to current $I_p$, but equal currents may cause capacitor 312 to charge too quickly).

As further shown in FIG. 3, circuit 300 additionally includes a switch 320 which is connected between node M and ground, and a strobed comparator 322 which has a first input connected to node M, a second input connected to node P, and an output. Comparator 322, which is implemented as a high-gain comparator to increase the input sensitivity, outputs a comparison signal CMP which has a logic state that indicates whether the voltage on the first input is greater than the voltage on the second input.

In addition, circuit 300 also includes a control logic block 326 that outputs the control word DCW to capacitor 312, the switch pulse SW to switch 320, and a strobe signal STB to comparator 322. Further, control logic block 326, which includes a timer, receives a clock signal CLK from a clock, such as a 250 MHz clock, the comparison signal CMP from comparator 322, and a control signal CNTR.

Logic block 326 may also include circuitry that outputs a slave control word DCWO which is a decoupled version of the digital control word DCW. The slave control word DCWO is used to tune other slave RC circuits that are implemented with a resistor and a variable capacitor. By decoupling the slave control word DCWO from the control word DCW, the slave circuits are prevented from being effected by the LSB toggling as described in greater detail below. In addition, logic block 326 can include built-in hooks which allow the entire block to be tested by automatic test equipment (ATE) for mass production.

FIGS. 4A–4E show timing diagrams that illustrate the operation of circuit 300. Prior to operation, which begins at time $t_0$, switch 320 is closed. Thus, the voltage $V_M$ is equal to ground. In addition, the voltage $V_p$, which is on the second input of comparator 322, is constant and defined by the following equation as:

$$V_P = I_p R_p. \quad \text{EQ. 2}$$

When operation begins at time $t_0$, logic block 326 outputs the switch pulse SW. In response to the rising edge of the switch pulse SW, switch 320 opens, and logic block 326 begins counting (via the timer) the rising edges of the clock signal CLK. At the same time, as shown in FIG. 4C, the voltage $V_M$, which is on the first input of comparator 322, rises linearly, due to the constant current $I_M$ charging capacitor 312, as described by the following equation:

$$V_M = (I_P/C_M)^* t, \quad \text{EQ. 3}$$

where t represents the elapsed time. Thus, as shown in EQ. 3, the voltage $V_M$ charges up linearly. One of the advantages of utilizing a linear charging curve is that a linear charging curve allows for greater time step resolution and voltage comparison accuracy than an exponential curve, such as the exponential curve produced by circuit 100.

When a predetermined time expires, logic block 326 outputs the strobe signal STB to comparator 322 at time $t_1$ which, in turn, compares the voltage $V_M$ on node M with the voltage $V_p$ on node P at that instant. Comparator 322 compares values only at the rising edge of the strobe signal STB, and holds its previous value otherwise. If the voltage $V_M$ is less than the voltage $V_p$ as indicated by the logic state of the comparison signal CMP, logic block 326 updates the control word DCW to decreases the capacitance $C_M$, and then outputs the updated control word to capacitor 312. On the other hand, if the voltage $V_M$ is greater than the voltage $V_p$ as indicated by the logic state of the comparison signal CMP, logic block 326 updates the control word DCW to increase the capacitance $C_M$, and then outputs the updated control word to capacitor 312.

After comparator 322 has made a comparison, the falling edge of the switch pulse SW at time $t_2$ causes switch 320 to close, and the timing function to be reset. When switch 320 closes, the voltage $V_M$ across capacitor 312 discharges back to ground. Once back to ground, circuit 300 is ready to begin another comparison with the next rising edge of the switch signal SW.

In an alternate embodiment, rather than updating the control word DCW with each comparison, logic block 326 can average the logic states of a plurality of comparison signals CMP, and then update the control word DCW with the result of the average. The advantage of averaging a number of comparisons, such as 16, is that an averaged comparison reduces the effect of noise and other error sources.

The comparison process is repeated to servo the capacitance $C_M$ of capacitor 312, and thereby the RC time constant, to a predetermined value. As shown in FIGS. 4A–4E, in the first period, the voltage $V_M$ is less than the voltage $V_p$ when the control word DCW is set to (DAC+2) where DAC is some arbitrary value used for illustration. Since the voltage $V_M$ is less than the voltage $V_p$, the control word DCW is decreased to (DAC+1) to decrease the capacitance $C_M$. In the second period, the voltage $V_M$ is again less than the voltage $V_p$ when the strobe signal STB occurs at time $t_3$, but is greater than the previous voltage $V_M$. Since the voltage $V_M$ is still less than the voltage $V_p$, the control word DCW is again decreased to (DAC) to further decrease the capacitance $C_M$.

In the third period, however, the voltage $V_M$ is now greater than the voltage $V_p$ when the strobe signal STB occurs at time $t_4$. Since the voltage $V_M$ is now greater than the voltage $V_p$, the control word DCW is increased to (DAC+1) to increase the capacitance $C_M$. Once the control word DCW begins to toggle between the value that causes the voltage $V_M$ to be just greater than the voltage $V_p$, and the value that causes the voltage $V_M$ to be just less than the voltage $V_p$, logic block 326 detects this condition and inhibits the toggling (also referred to as LSB hunting) from appearing on the control word DCWO. Following this, logic block 326 periodically resets the control word DCWO to equal to the control word DCW, and thereby the RC time constant, to compensate for variations in voltage and temperature.

Logic block 326 can be programmed to servo the capacitance $C_M$, and thereby the RC value, to any value (via the control signals $C_N$ TR) as long as capacitor 312 has enough range. In addition, the control signals $C_N$ TR can command logic block 326 to set the capacitance $C_M$ of capacitor 312 to a preselected value, thereby bypassing the loop entirely.

Once the toggling condition occurs, the voltage $V_M$ is equal to the voltage $V_P$ (to within the LSB of the control word DCW). As noted above, the voltage $V_p$ is defined by EQ. 2 as $V_p = I_p R_p$, while the voltage $V_M$ is defined by EQ. 3 as $V_M = (I_M/C_M)*T$, where T is a fixed time that equals the period of the clock signal CLK multiplied by the count. Setting these two equations equal to each other yields the following equation:

$$I_p R_p = (I_M/C_M)*T. \qquad \text{EQ. 4}$$

Rearranging the two equations yields the following equation:

$$R_P C_M = (I_M/I_P)*T. \qquad \text{EQ. 5}$$

Thus, as shown by EQ. 5, the final value of $R_p$ and $C_M$ depends on the ratio of the two currents ($I_M$ and $I_p$), and on the value of time T. In the preferred embodiment, both currents $I_M$ and $I_p$ are derived from a current which is obtained by dumping a constant bandgap voltage across a polysilicon resistor. This places a constant voltage on node P, and on the second input of comparator 322, which, in turn, significantly reduces the design constraints on comparator 322 as the comparator common mode is fixed at a known value and does not vary.

In the metastable state, where voltage $V_M$ and voltage $V_p$ are equal, the logic state of the comparison signal CMP output by comparator 322 may settle to an incorrect value. However, in the next cycle, comparator 322 will make the correct decision and hunt back to the metastable state. In this pathological case, circuit 300 can hunt by two LSBs rather than one LSB. To minimize this, the present invention sets each step of the capacitor DAC 312 to move approximately 50mV, which is more than any noise or metastability that might exist.

Figure 5:
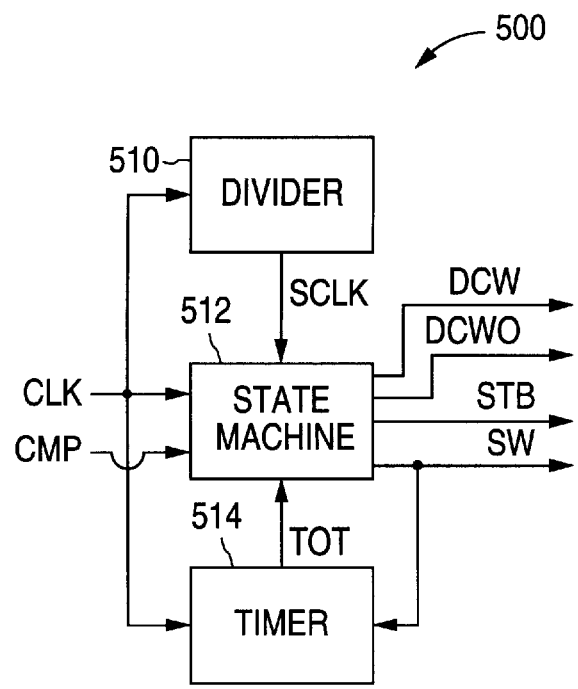
FIG. 5 is a block diagram illustrating logic block 500 in accordance with the present invention.

FIG. 5 shows a block diagram that illustrates a logic block 500 in accordance with the present invention. As shown in FIG. 5, logic block 500, which represent one implementation of logic block 326, includes a frequency divider 510 that receives the clock signal CLK, and outputs a divided clock signal SCLK which has a frequency that is lower than the clock signal CLK.

In addition, logic block 500 includes a state machine 512 that receives the clock signal CLK, the divided clock signal SCLK, the comparison signal CMP, and a time-out signal TOT. In addition, state machine 512 outputs the switch pulse SW and the strobe signal STB. Further, logic block 500 includes a timer 514 that receives the clock signal CLK and the switch pulse SW, and outputs the time-out signal TOT.

In operation, state machine 512 outputs the switch pulse SW in response to the divided clock signal SCLK. Timer 514, in turn, begins counting in response to the rising edge of the switch pulse SW, which also causes switch 320 to open. (Timer 514 may be controlled by another signal if propagation and other timing issues prevent the switch pulse SW from being used to control timer 514.)

When a predetermined count is reached (timer 514 can be loaded with any count value), timer 514 outputs the time-out signal TOT, which, in turn, causes state machine 512 to output the strobe signal STB. The strobe signal STB causes the comparison signal CMP to become valid. State machine 512 latches the logic state of the comparison signal CMP, adjusts the control word DCW, and then outputs the control word DCW to capacitor 312 as described above.

Figure 6:
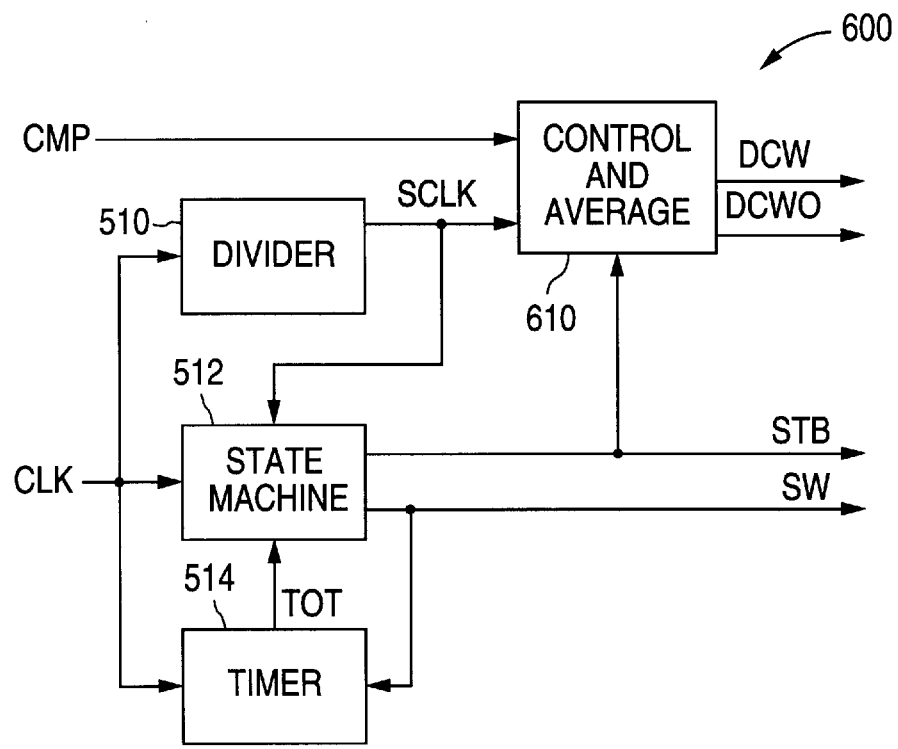
FIG. 6 is a block diagram illustrating a logic block 600 in accordance with an alternate embodiment of the present invention.

FIG. 6 shows a block diagram that illustrates a logic block 600 in accordance with the alternate embodiment of the present invention. Logic block 600 is similar to logic block 500 and, as a result, utilizes the same reference numbers to designate the structures which are common to both circuits.

As shown in FIG. 6, logic block 600 differs from logic block 500 in that logic block 600 includes a control and average circuit 610 that receives the divided clock signal SCLK, the comparison signal CMP, and the strobe signal STB, and outputs the control word DCW. Logic block 600 operates substantially the same as logic block 500 except that control and average circuit 610 latches the logic state of the comparison signal CMP each time that the strobe signal STB indicates that the comparison signal CMP is valid. After latching, for example, 16 logic states from the comparison signals CMP, circuit 610 averages the values, and then adjusts the control word DCW. As noted above, the advantage of averaging the logic states from a number of comparison signals CMP is that averaging reduces the effect of noise and other error sources.

One of the advantages of the present invention is that, unlike prior art comparators that rely on a reference voltage $V_{REF}$ that is subject to variations in process, voltage, and temperature, the voltage $V_p$ is relatively stable over process, voltage, and temperature variations. Thus, the decision point for comparator 322 does not vary much over process, voltage, and temperature.

Another advantage of the present invention is that, unlike prior art comparators that compare voltages during each clock cycle, comparator 322 compares the voltage on node M with the voltage on node P only once, that being when the timer times out and the strobe signal STB is output. As a result, comparator 322 can be disabled for most of the (long) charge cycle, and turned on just before comparator 322 is to be strobed to make a comparison. Thus, the present invention significantly reduces the power consumed by the comparator.

Further, since comparator 322 does not make a comparison during each clock cycle, comparator 322 does not have to be reset during each clock cycle. As a result, comparator 322 can operate with a clock frequency that is faster than twice the clock frequency utilized by comparator 122, thereby providing a greater degree of accuracy.

Furthermore, the comparison signal CMP output by comparator 322 is not latched by logic block 326, state machine 512, and average circuit 610 for an arbitrarily long time after the strobe signal STB pulses. Instead, the logic state of the comparison signal CMP is latched on the falling edge of the switch signal SW which, in turn, is controlled by the clock signal SCLK output by divider 510.

Thus, comparator 322 has one-half of the clock period SCLK to reset for the next comparison As a result, there are effectively no speed limitations on the comparator itself. The comparator only needs to have a large gain and low offset voltage. These are easily achieved by using positive feedback to obtain extremely large gain and large device sizes to reduce mismatch. As a result the resolution of this circuit can be increased by increasing the time constant (RC) used in the circuit and by increasing the frequency of the clock signal CLK.

Although a counter can be utilized, logic block 326, state machine 512, and average circuit 610 preferably use a linear feedback shift register (LFSR) to implement the timer functionality. LFSRs are less complex than binary counters and can be run at much faster clock rates.

In summary, the architecture of this circuit greatly relaxes design requirements on the analog components (e.g. the comparator) and its accuracy is only limited by the speed at which the timer can operate.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An RC calibration circuit comprising:

a first current source that sources a first current into a first node;

a second current source that sources a second current into a second node;

a switch connected between the second node and ground, the switch having an open position and a closed position;

a resistor connected between the first node and ground, the resistor generating a first voltage in response to the first current;

a variable capacitor connected between the second node and ground, the capacitor having a plurality of capacitances, and selecting one of the capacitances in response to a control word, the capacitor forming a second voltage in response to the second current charging up the capacitor when the switch is in the open position, the second current linearly charging the capacitor;

a strobed comparator which has a first input connected to the second node, a second input connected to the first node, and an output, the comparator comparing the first voltage to the second voltage in response to a strobe signal, and outputting an indication of whether the first voltage is greater than the second voltage; and a control logic block connected to the switch, the capacitor, and the comparator, the logic block controlling the opening and closing of the switch and the output of the strobe signal such that the comparator compares the first voltage to the second voltage after a predefined time has elapsed since the switch was placed in the open position.

2. The circuit of claim 1 wherein the control logic block adjusting the control word in response to the indication from the comparator.

3. The circuit of claim 1 wherein the control logic block averages a number of indications to form an averaged indicator, and adjusts the control word in response to the averaged indicator.

4. The circuit of claim 1 wherein the control logic block includes:

a divider that receives a first periodic signal that has a first frequency, and outputs a second periodic signal that has a second frequency, the second frequency being less than the first frequency;

a timer that counts a predefined number of first periodic signals, and outputs a time-out signal when the predefined number of first periodic signals have elapsed, the predefined number of first periodic signals defining the predefined time; and a state machine that commands the timer to begin counting, and the switch to open in response to the second periodic signal, outputs a strobe signal in response to the time-out signal, adjusts the control word in response to the indication, and outputs the control word to the capacitor.

5. The circuit of claim 1 wherein the control logic block includes:

a divider that receives a first periodic signal that has a first frequency, and outputs a second periodic signal that has a second frequency, the second frequency being less than the first frequency;

a timer that counts a predefined number of first periodic signals, and outputs a time-out signal when the predefined number of first periodic signals have elapsed, the predefined number of first periodic signals defining the predefined time;

a state machine that commands the timer to begin counting, and the switch to open in response to the second periodic signal, outputs a strobe signal in response to the time-out signal, and commands the switch to close after the strobe signal has been output; and a control and average circuit that averages a predetermined number of indications from the comparator, adjusts the control word in response to the indications, and outputs the control word to the capacitor.

6. The circuit of claim 1 wherein the resistance of the resistor multiplied by the capacitance of the capacitor is equal to a ratio of the first current to the second current multiplied by a fixed time.

7. The circuit of claim 1 wherein the variable capacitor includes a capacitor digital-to-analog converter (DAC).

8. The circuit of claim 4 wherein the comparator is reset in a time period equal to one-half of the period of the second frequency, and the output of the comparator is latched in response to the second periodic signal.

9. A method for calibrating an RC time constant, the method comprising the steps of:

generating a first voltage;

forming a second voltage by charging up a capacitor, the capacitor having a capacitance;

counting a predefined number of first periodic signals with a timer;

comparing the first voltage to the second voltage with a comparator after the predefined number of first periodic signals have been counted by the timer; and outputting from the comparator an indication of whether the first voltage is greater than the second voltage.

10. The method of claim 9 and further comprising the step of adjusting the capacitance provided by the capacitor in response to the indication.

11. The method of claim 9 and further comprising the steps of:

repeating the forming, counting, comparing, and outputting steps to form a predetermined number of indications;

averaging the predetermined number of indications to form an averaged indication; and adjusting the capacitance provided by the capacitor in response to the average indication.

12. The method of claim 9 wherein the capacitor is linearly charged up.

13. The method of claim 9 wherein the first voltage is generated by sourcing a first current into a resistor.

14. The method of claim 13 wherein a second current is sourced into the capacitor to charge up the capacitor.

15. The method of claim 14 wherein the second current is a scaled version of the first current.

16. The method of claim 14 wherein the first and second currents are formed by dropping a bandgap voltage across current source resistors that are substantially the same as the resistor connected between the first node and ground.

17. The method of claim 13 wherein the resistance of the resistor multiplied by the capacitance of the capacitor is equal to a ratio of the first current to the second current multiplied by a fixed time.

18. The method of claim 14 wherein the first and second currents are constant currents at a given operating condition.

* * * * *